United States Patent [19]

Yoshikawa et al.

[11] Patent Number: 5,068,876
[45] Date of Patent: Nov. 26, 1991

[54] PHASE SHIFT ANGLE DETECTOR

[75] Inventors: Shuuichi Yoshikawa, Nara; Masahiko Watanabe, Yamatokoriyama; Michio Ikeuchi, Nara; Yasumoto Murata, Tenri; Takahiko Nakano, Ikoma, all of Japan

[73] Assignee: Sharp Kabushiki Kaisha, Osaka, Japan

[21] Appl. No.: 330,444

[22] Filed: Mar. 30, 1989

[30] Foreign Application Priority Data

Apr. 1, 1988 [JP] Japan ................................ 63-81720

[51] Int. Cl.$^5$ .............................................. H03D 3/22
[52] U.S. Cl. ......................................... 375/80; 375/86; 329/306
[58] Field of Search ..................... 375/39, 80, 85, 86, 375/77, 89, 96, 84, 53, 50; 329/304, 306, 346; 455/216

[56] References Cited

U.S. PATENT DOCUMENTS

| 3,806,815 | 4/1974 | Fletcher et al. | 375/86 X |
| 4,317,210 | 2/1982 | Dekker et al. | 375/80 X |
| 4,731,796 | 3/1988 | Masterton et al. | 375/9 |

Primary Examiner—Benedict V. Safourek
Assistant Examiner—Tesfaldet Bocure

[57] ABSTRACT

A phase shift angle detector for detecting a phase shift angle of a multiphase modulated signal includes a first multiplier coupled with a first low pass filter for producing a cosine wave signal having a phase which is a sum of a phase shift $\phi e$ and the modulated signal g(t), and a second multiplier coupled with a second low pass filter for producing a sine wave signal having a phase which is a sum of a phase shift $\phi e$ and the modulated signal g(t). A circuit is provided for calculating an inverse tangent using the cosine wave signal and the sine wave signal to produce a signal representing the pahse shift $\phi e$.

3 Claims, 1 Drawing Sheet

PHASE SHIFT ANGLE DETECTOR

BACKGROUND OF THE INVENTION

1. Field of the Invention

The present invention relates to a phase shift angle detector for detecting the phase shift angle of a carrier wave, used in a demodulator, of a multiphase modulated signal, such as 4-phase or 8-phase modulated signal. Such a system may be utilized voice frequency cable communication, such as with a telephone.

2. Description of the Prior Art

A typical phase shift angle detector is shown in FIG. 2. The phase shift angle detector receives a multiphase modulated signal $\delta(t)$ $$\delta(t) = A \cos(\omega ct + g(t) + \phi e) \tag{1}$$

in which A is an amplitude, $\omega c$ is an angular frequency, $\phi e$ is a phase shift, and $g(t)$ is the modulated signal. The multiphase modulated signal $\delta(t)$ is applied to multipliers 21 and 22. In multiplier 21, the signal $\delta(t)$ is multiplied by the signal $\cos \omega ct$ having the same phase component as that of the input signal $\delta(t)$. Further in in multiplier 22, the signal $\delta(t)$ is multiplied by the signal $\sin \omega ct$ having a phase which is phase shifted 90 degrees from the phase of the input signal $\delta(t)$. Thus, multipliers 21 and 22 generate signals which can be expressed, respectively, by the following equations (2) and (3).

$$\tfrac{1}{2}A\{\cos(2\omega ct + \phi e + g(t)) + \cos(\phi e + g(t))\} \tag{2}$$

$$\tfrac{1}{2}A\{\sin(2\omega ct + \phi e + g(t)) + \sin(\phi e + g(t))\} \tag{3}$$

The output signals (2) and (3) from multipliers 21 and 22 are applied to low pass filters 23 and 24, respectively, for deleting the signals having an angular frequency $2\omega ct$. Thus, low pass filters 23 and 24 generate signals which can be expressed by the following equations (4) and (5), respectively.

$$\tfrac{1}{2}A \cos(\phi e + g(t)) \tag{4}$$

$$\tfrac{1}{2}A \sin(\phi e + g(t)) \tag{5}$$

Then, signals (4) and (5) are applied to a decision device 25 so that signals (4) and (5) are changed to signals given by the following equations (6) and (7), respectively.

$$\tfrac{1}{2}A \cos(g(t)) \tag{6}$$

$$\tfrac{1}{2}A \sin(g(t)) \tag{7}$$

The signals (6) and (7) produced from the decision device 25 are applied together with the signals (4) and (5) from the low pass filters to multipliers 26, 27, 28 and 29 and further to adders 30 and 31 in a manner shown in FIG. 2. This is so that adders 30 and 31 generate signals which can be expressed by the following equations (8) and (9), respectively.

$$\tfrac{1}{4}A^2 \cos \phi e \tag{8}$$

$$\tfrac{1}{4}A^2 \sin \phi e \tag{9}$$

From these two signals (8) and (9), inverse tangent ($\tan^{-1}$) is calculated in calculator 32 to obtain phase shift angle $\phi e$.

The above can be further explained as follows.

When the multiphase modulated signal $\delta(t)$ is expressed as, $$\delta(t) = e^{j\{\omega ct + g(t) + \phi e\}} \tag{10}$$

the amplitude of the carrier metered in the same phase component and the orthogonal phase component can be expressed on the rectangular coordinate axis by the following equation (11), $$Z(t) = e^{j\{g(t) + \phi e\}} \tag{11}$$

When the output of the decision device 25 is expressed as, $$D(t) = e^{j\{g(t)\}} \tag{12}$$

the phase shift angel can be given by the following equation (13).

$$\phi e = \tan^{-1}[Z(t) \cdot \text{conj}\{D(t)\}] \tag{13}$$

('conj' represents a conjugate complex number)

According to the prior art phase shift angle detector, since the decision device 25 is necessary, the circuit is complicated.

SUMMARY OF THE INVENTION

The present invention has been developed with a view to substantially solving the above described disadvantages and has for its essential object to provide an improved phase shift angle detector which is simple in structure and does not use the decision device.

In accomplishing these and other objects, a phase shift angle detector according to the present invention includes a first multiplying device for multiplying the multiphase modulated signal by a first signal having the same phase as that of the multiphase modulated signal, and for producing a first multiplied signal; a second multiplying device for multiplying the multiphase, modulated signal by a second signal having a phase which is phase shifted 90 degrees from the phase of the multiphase modulated signal, and for producing a second multiplied signal; a first low pass filter for receiving the first multiplied signal and for filtering a signal component having a frequency greater that a first predetermined frequency; a second low pass filter for receiving the second multiplied signal and for filtering a signal component having a frequency greater than the first predetermined frequency; a device for calculating an absolute phase angle of the multiphase modulated signal upon receipt of the filtered signal from the first and second low pass filters; and a third multiplying device for multiplying the absolute phase angle by a number of phases in the multiphase modulated signal.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DETAILED DESCRIPTION OF THE PREFERRED EMBODIMENTS

Figure 1:
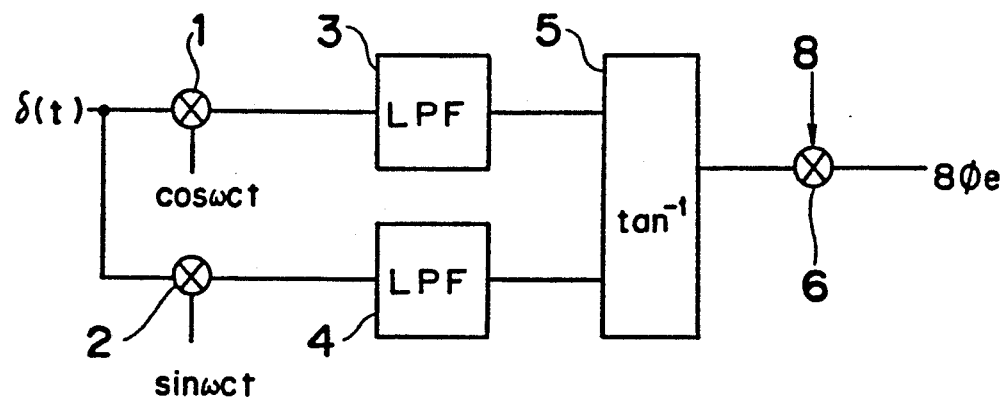
FIG. 1 is a circuit diagram of a phase shift angle detector according to a preferred embodiment of the present invention.
Figure 2:
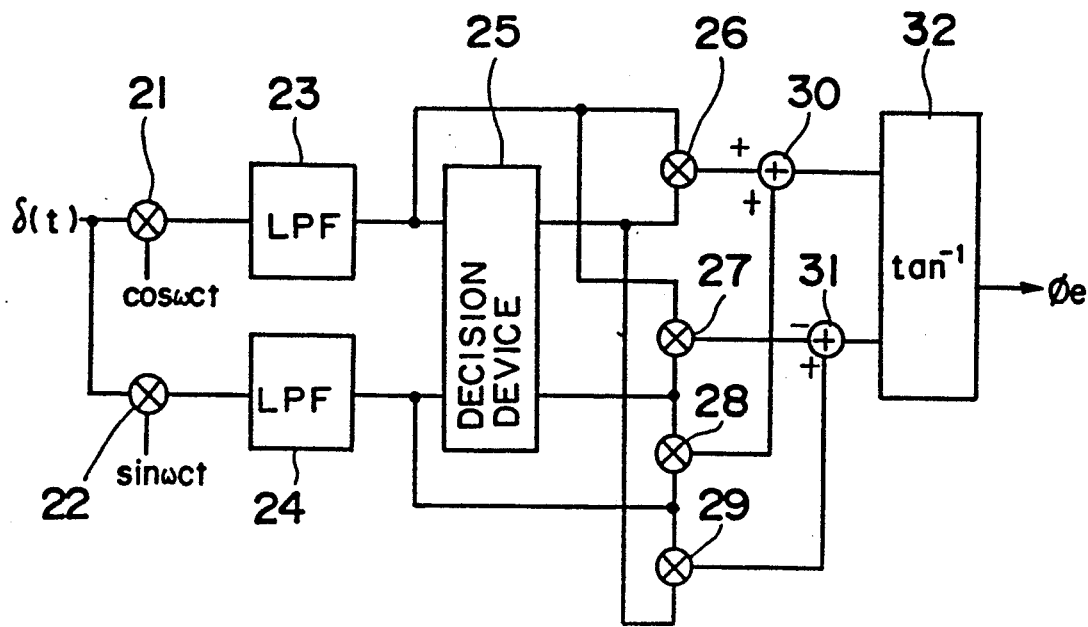
FIG. 2 is a circuit diagram of a phase shift angle detector according to the prior art.

Referring to FIG. 1, a phase shift angle detector according to the present invention is shown. Provided in the phase shift angle detector is a first multiplier 1 which receives the multiphase modulated signal δ(t)

$$\delta(t) = A \cos(\omega ct + g(t) + \phi e) \quad (1)$$

in which A is an amplitude, ωc is an angular frequency, φe is a phase shift, and g(t) is the modulated signal. The first multiplier 1 multiplies the received signal δ(t) by a signal cos ωct having the same phase component as that of the multiphase modulated signal. Also provided is a second multiplier 2 which receives the multiphase modulated signal δ(t) and multiplies the received signal δ(t) by a signal sin ωct having a phase component which is phase shifted 90 degrees from that of the multiphase modulated signal. The outputs from the multipliers 1 and 2, which can be expressed as follows, $$\tfrac{1}{2}A\{\cos(2\omega ct + \phi e + g(t)) + \cos(\phi e + g(t))\} \quad (2)$$

$$\tfrac{1}{2}A\{\sin(2\omega ct + \phi e + g(t)) + \sin(\phi e + g(t))\} \quad (3)$$

are applied to low pass filters 3 and 4, respectively, so as to delete the signals having an angular frequency 2ωct. Thus, low pass filters 3 and 4, respectively, produces outputs as expressed below.

$$\tfrac{1}{2}A\cos(\phi e + g(t)) \quad (4)$$

$$\tfrac{1}{2}A\sin(\phi e + g(t)) \quad (5)$$

The outputs from low pass filters 3 and 4 are applied to a calculator 5 which calculates an inverse tangent (tan$^{-1}$) to obtain an absolute phase shift angle θz = φe + g(t) which is a phase shift angle for one phase.

Generally, the modulated signal g(t) can be given by the following equation (14), $$g(t) = (1/N) \cdot 2\pi \cdot k$$

wherein N is a number of phases and k is an arbitrary integer. Thus, the absolute phase θz can be expressed as, $$\theta z = \phi e + (1/N) \cdot 2\pi \cdot k \quad (15)$$

which can be revised as, $$N\theta z = N\phi e + 2\pi \cdot k \quad (16)$$

In equation (16), since 2π·k can be considered as equal to zero, Nθz = Nφe is obtained and thus, the absolute phase shift angle θz = φe for one phase is obtained and is produced from calculator 5.

The output of calculator 5 is applied to a multiplier 6 for multiplying the phase shift angle with the number of phases in the multiphase modulated signal. In the embodiment shown in FIG. 1, an 8-phase modulated signal is assumed to be processed. Therefore, multiplier 6 multiplies the output signal from calculator 5 by eight.

According to the phase shift angle detector of the present invention, the absolute phase shift angle is first calculated and then, the same is multiplied by the number of phases involved. Since the phase shift angle detector of the present invention employs no decision device, the circuit thereof can be simplified.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A phase shift angle detector for detecting a phase shift angle of a multiphase modulated signal having N-phases, N being an integer, comprising:
   first multiplier means for receiving and multiplying the multiphase modulated signal by a cosine wave signal and for, upon outputting a multiplied signal to first low pass filter, producing from said first low pass filter a cosine wave signal having a phase which is representative of a sum of a phase shift φe and the multiphase modulated signal g(t);
   second multiplier means for receiving and multiplying the multiphase modulated signal by a sine wave signal and for, upon outputting a multiplied signal to a second low pass filter, producing from said second low pass filter a sine wave signal having a phase which is representative of a sum of a phase shift φe and the multiphase modulated signal g(t); and
   calculation means for receiving said sine wave and cosine wave signals produced from said first and second low pass filters and for calculating an inverse tangent using the cosine wave signal and the sine wave signal and for multiplying said inverse tangent by said N to produce a signal representing the phase shift angle φe.

2. A phase shift angle detector for detecting a phase shift angle of a multiphase modulated signal having N-phases, N being an integer, comprising:
   first multiplying means for multiplying said multiphase modulated signal by a first signal having the same phase as that of said multiphase modulated signal, and for producing a first multiplied signal;
   second multiplying means for multiplying said multiphase modulated signal by a second signal having a phase which is phase shifted 90 degrees from the phase of said multiphase modulated signal, and for producing a second multiplied signal;
   first low pass filter for receiving said first multiplied signal and for filtering a signal component having a frequency greater than a first predetermined frequency;
   second low pass filter for receiving said second multiplied signal and for filtering a signal component having a frequency greater than said first predetermined frequency;
   means for calculating an absolute phase angle of said multiphase modulated signal upon receipt of the filtered signal from said first and second low pass filters; and
   third multiplying means for multiplying said absolute phase angle by said N to thereby produce a signal commensurate with the phase shift angle.

3. A phase shift angle detector for detecting a phase shift angle of a multiphase modulated signal δ(t) having N-phases $$\delta(t) = A \cos(\omega ct + g(t) + \phi e)$$

in which A is an amplitude, $\omega c$ is an angular frequency, $\phi e$ is a phase shift, and g(t) is the modulated signal, comprising:

first multiplying means for multiplying said multiphase modulated signal $\delta(t)$ by a first signal $\cos\omega ct$ having the same phase as that of said multiphase modulated signal, and for producing a first multiplied signal, $$\tfrac{1}{2}A\{\cos(2\omega ct+\phi e+g(t))+\cos(\phi e+g(t))\};$$

second multiplying means for multiplying said multiphase modulated signal $\delta(t)$ by a second signal $\sin \omega ct$ having a phase which is phase shifted 90 degrees from the phase of said multiphase modulated signal, and for producing a second multiplied signal, $$\tfrac{1}{2}A\{\sin(2\omega ct+\phi e+g(t))+\sin(\phi e+g(t))\};$$

first low pass filter for receiving said first multiplied signal and for filtering a signal component having a frequency greater than a first predetermined frequency to produce a first filtered signal, $$\tfrac{1}{2}A\cos(\phi e+g(t));$$

second low pass filter for receiving said second multiplied signal and for filtering a signal component having a frequency greater than said first predetermined frequency to produce a second filtered signal, $$\tfrac{1}{2}A\sin(\phi e+g(t));$$

and means for calculating an inverse tangent using said first and second filtered signals and multiplying the inverse tangent by said N t produce a signal representing an absolute phase angle $\phi e$ of said multiphase modulated signal.

* * * * *